United States Patent
Lehr et al.

(10) Patent No.: US 9,594,110 B2
(45) Date of Patent: Mar. 14, 2017

(54) INSULATION MONITORING DEVICE FOR SIMULTANEOUSLY MONITORING NETWORK SECTIONS OF AN UNGROUNDED POWER SUPPLY SYSTEM

(71) Applicant: Bender GmbH & Co. KG, Gruenberg (DE)

(72) Inventors: Mario Lehr, Gruenberg (DE); Carsten Weiss, Laubach (DE); Hans-Juergen Jaeger, Alsfeld (DE)

(73) Assignee: BENDER GMBH & CO. KG, Gruenberg (DE)

( * ) Notice: Subject to any disclaimer, the term of this patent is extended or adjusted under 35 U.S.C. 154(b) by 19 days.

(21) Appl. No.: 14/600,104

(22) Filed: Jan. 20, 2015

(65) Prior Publication Data

US 2015/0204937 A1    Jul. 23, 2015

(30) Foreign Application Priority Data

Jan. 21, 2014   (DE) ................. 10 2014 201 044

(51) Int. Cl.
- *G01R 31/08*   (2006.01)
- *G01R 31/12*   (2006.01)
- *G01R 31/02*   (2006.01)
- *H02H 3/17*    (2006.01)
- *G01R 27/18*   (2006.01)

(52) U.S. Cl.
CPC ....... *G01R 31/1272* (2013.01); *G01R 31/025* (2013.01); *H02H 3/17* (2013.01); *G01R 27/18* (2013.01)

(58) Field of Classification Search
CPC .. G01R 31/1272; G01R 31/025; G01R 27/18; G01R 31/12; G01R 31/002; G01R 31/08; H02H 3/17
USPC ................ 324/541, 544, 548, 549, 551, 671
See application file for complete search history.

(56) References Cited

U.S. PATENT DOCUMENTS

| | | | | |
|---|---|---|---|---|
| 8,264,234 B2 * | 9/2012 | Yano | ..................... | B60L 3/0046 324/509 |
| 9,164,140 B2 * | 10/2015 | Moell | ................... | G01R 31/025 |
| 2002/0171434 A1 * | 11/2002 | Stanford | ............ | G01R 31/1272 324/541 |
| 2003/0234653 A1 * | 12/2003 | Kollenda | ............. | G01R 31/025 324/551 |
| 2011/0227584 A1 * | 9/2011 | Beck | .................... | G01R 31/129 324/551 |

FOREIGN PATENT DOCUMENTS

DE    102010011476 A1    9/2011

* cited by examiner

*Primary Examiner* — Alessandro Amari
*Assistant Examiner* — Michael Konczal
(74) *Attorney, Agent, or Firm* — King & Schickli, PLLC

(57) ABSTRACT

The invention relates to an insulation monitoring device for simultaneously monitoring an ungrounded power supply system comprising network sections that can be interconnected via coupling switches, comprising a signal generator for generating a measuring signal and a coupling circuit for coupling the measuring signal to the power supply system. According to the invention, the insulation monitoring device comprises a coupling circuit for each interconnectable network section to be monitored, a switchable electrical connecting element being arranged for connecting adjacent coupling circuits.

5 Claims, 1 Drawing Sheet

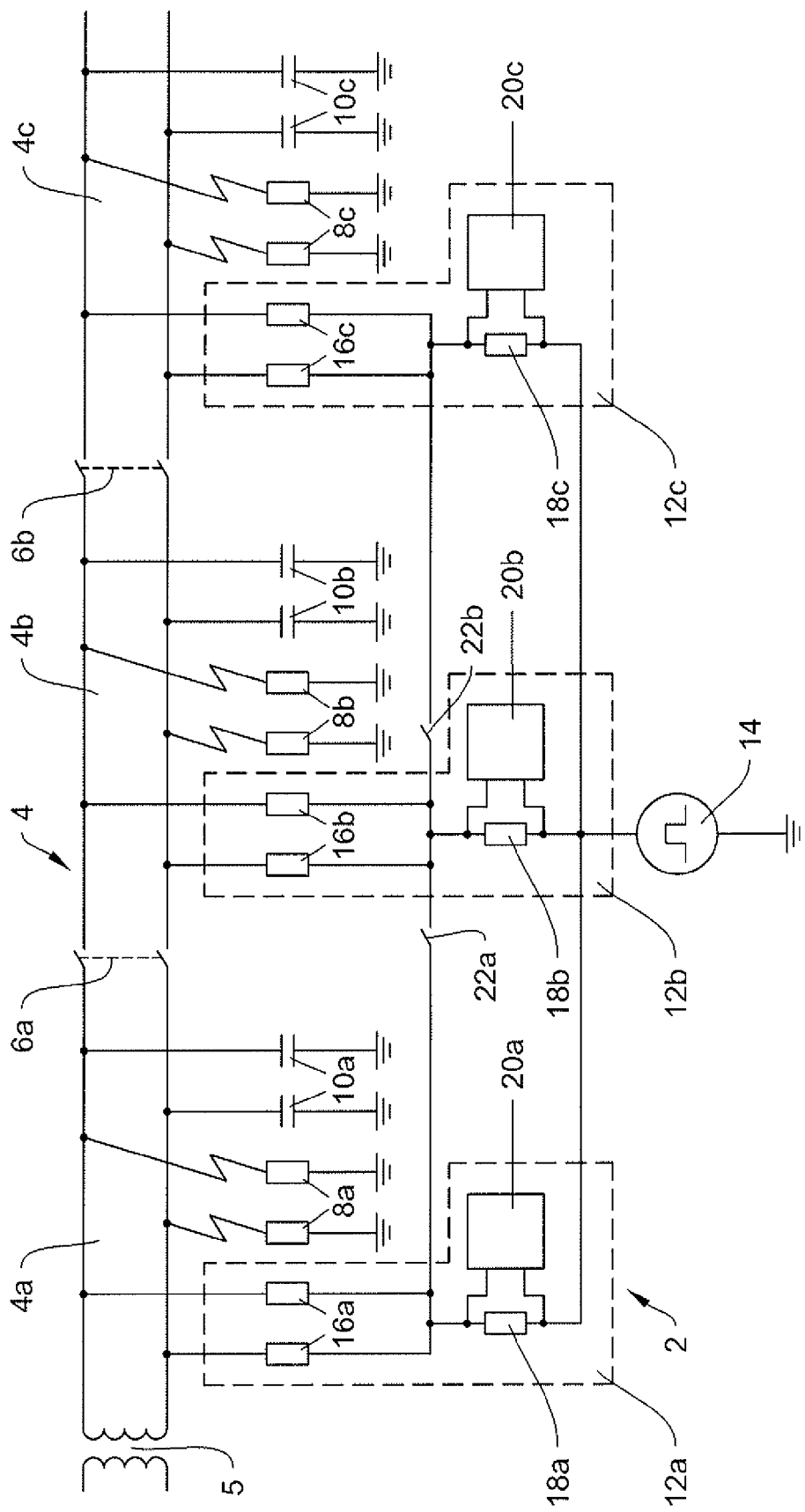

INSULATION MONITORING DEVICE FOR SIMULTANEOUSLY MONITORING NETWORK SECTIONS OF AN UNGROUNDED POWER SUPPLY SYSTEM

This application claims the benefit of German Patent Application No. 10 2014 201 044.6, the disclosure of which is incorporated herein by reference.

TECHNICAL FIELD

The invention relates to an insulation monitoring device for simultaneously monitoring an ungrounded power supply system comprising network sections that can be interconnected via coupling switches, comprising a signal generator for generating a measuring signal and a coupling circuit for coupling the measuring signal to the power supply system.

BACKGROUND

To ensure high availability and operational safety of the electrical power supply and to guarantee personnel safety in the operating area of electrical installations, power supply networks are increasingly used whose active components are separated from the ground potential. In this kind of power supply network, called IT system, an active conductor may exhibit an insulation fault without making it necessary to interrupt the ongoing operation of the installation because no closed circuit can form in this first fault case owing to the ideally infinitely high impedance value between the conductor and ground. In this context, an insulation fault is a faulty state of the IT system that causes the insulation resistance to drop below the admissible insulation level. It becomes clear from this consideration that the resistance against ground (insulation resistance) in the network to be monitored has to be monitored constantly because a potential other fault in another active conductor (second fault) would cause a fault loop and the flowing fault current, in connection with an overcurrent protection device, would result in a shutdown of the installation and in a standstill of operation.

Actively measuring insulation monitoring devices known from the state of the art are connected in the main branch of the IT system between the network conductors and ground via a coupling circuit and superimpose a measuring voltage on the network that is generated by a signal generator and leads to a current flow that is proportional to the insulation resistance. This measuring current causes a voltage drop at a measuring resistance of the insulation monitoring device, said voltage drop being evaluated and leading to a warning message if a pre-settable limit value is exceeded. However, insulation monitoring by means of active insulation monitoring devices as well as by means of insulation monitoring devices that work passively in a switching manner is accompanied by the restriction that only a single insulation monitoring device of this kind can be used per IT system, i.e. per feed point in practice. If multiple insulation monitoring devices of this kind are used per IT system, measured-value registration is disrupted because the devices interfere with one another. On the other hand, if purely passively working insulation monitoring devices are used, not all insulation fault constellations can be registered, in particular not symmetrical insulation losses; hence, these devices can only be used to a limited extent.

Oftentimes, there is the problem that the network sections of a power supply system are supposed to be monitored individually, i.e. in the separated state, yet the network sections can also be electrically interconnected.

Several known solutions exist for this problem:

a. Turning Off Insulation Monitoring Devices

Each network section is monitored in the separated state by its own insulation monitoring device. If network sections are interconnected, the respective redundant insulation monitoring devices are turned off so that only a single device remains online.

This strategy is proved and tested, but it is elaborate because a full-fledged insulation monitoring device is required for each network section that must be capable of completely separating itself from the network when being turned off so that it does not interfere with the measurement of the remaining insulation monitoring device because of its internal resistance. The construction of devices of this kind is elaborate in particular in case of high nominal voltages, which makes their acquisition expensive.

b. Automatic Alternating Operation of the Insulation Monitoring Devices

Each network section is monitored by its own insulation monitoring device. The devices communicate with one another and work in alternating operation so that only a single device is actively coupled to the network at any given time. This method, too, is proved and tested, but it is also accompanied by high costs in acquisition and by the fact that simultaneous monitoring of the separated network sections is impossible without changing the configuration because the devices are constantly in alternating operation irrespective of the switching status of the network.

c. Scanning Systems

An insulation monitoring device is successively coupled to different points of a network by means of a multiplexer circuit. Scanning systems of this kind are difficult to control because, for optimal function, they should be adapted to the measuring method of the respective insulation monitoring device. Additionally, in case of high nominal voltages, increasingly elaborate switching elements are required owing to the necessary voltage differences so that the cost benefit in relation to the previously considered solutions decreases.

d. Additional Use of Passive Insulation Monitoring Devices

An active main insulation monitoring device is used in a central network section. In all other network sections, insulation monitoring devices with a passive measuring method are used.

Passive insulation monitoring devices usually have a simple structure, which makes them cost-effective. It is disadvantageous, however, that symmetrical insulation faults, which often occur because of aging conductors and components, for example, can be detected by the main insulation monitoring device only after the network sections have been interconnected.

SUMMARY

Therefore, it is the object of the present invention to design an insulation monitoring device by means of which network sections of an ungrounded power supply system can be monitored both in the separated and in the interconnected state with little technical effort.

This object is attained in connection with the preamble of claim 1 in that the coupling circuit is provided for each network section to be monitored and in that a switchable electrical connecting element is arranged for connecting adjacent coupling circuits.

Thus, according to the invention, the insulation monitoring device has a coupling circuit for each interconnectable network section to be monitored. Via this coupling section, the measuring signal, which is generated by a common signal generator, can be fed into the respective network section, which is in a separated state. Thus, a separate measuring circuit forms for each network section when the coupling switches are open. The respective coupling circuit can be advantageously tailored to the electrical characteristics, in particular to the expected ground impedance and the resulting pulse response of the respective network section.

Moreover, according to the invention, the insulation monitoring device comprises a switchable electrical connecting element that is arranged between adjacent coupling circuits. Thus, the measuring circuits, which are separate when the coupling switches are open, can be interconnected to form a single measuring circuit when the coupling switches are closed by also closing the connecting elements.

In an equivalent circuit diagram of the interconnected operation, the resulting parallel arrangement of the coupling circuits can be considered as a single insulation monitoring device, which can also be advantageously treated in this manner with regard to signal evaluation.

In connection with the coupling switches between the network sections and owing to the arrangement of the switchable connecting elements between the coupling circuits, the advantageous possibility arises that the network section can be comprehensively monitored in the separated state by means of an active measuring method, but that a simple monitoring configuration is formed in terms of switching even when network sections are interconnected.

The monitoring of separated, i.e. zero-potential network sections offers in particular the advantage that, even prior to turning on the respective section, it is possible to make a statement regarding its state of insulation and dangerous situations can thus be avoided from the start. An approach of this kind is convenient in the field of application of electromobility, for example. There, the insulation state of a zero-potential high-voltage intermediate circuit can be tested first before the voltage of the traction batteries is applied.

Permanent (continuous) insulation monitoring of zero-current network sections is also advantageous in standby systems. For example, they may be emergency power supplies that are kept constantly ready for operation, but are only rarely actually used. These systems are subject to wear by aging like any other system, even if they are rarely operated.

Furthermore, the coupling circuit comprises a coupling resistance for connection to each active conductor of the network section and a measuring resistance that is connected in series with the coupling resistances.

In this way, the different expected network leakage capacitances are accommodated to the effect that the coupling resistances can be configured in such a manner that about the same measuring times arise for all network sections so that no unnecessary delays are caused by the required measuring pulse synchronization. Thus, in the interconnected operation, there are no longer any restrictions with regard to the measuring times or measuring accuracy in relation to the use of a single insulation monitoring device. Also, the requirement that is necessary in the case of absent connecting elements and states that provided secondary coupling paths must have a high resistance in order to be able to still achieve a passable measuring accuracy at the main coupling during interconnected operation no longer applies.

Preferably, the coupling circuit comprises a signal evaluation unit for evaluating the measured value of the measuring signal that is tapped via the measuring resistance.

The voltage drop at the measuring resistance caused by the measuring current is detected by a signal evaluation unit and evaluated with regard to an exceedance of the insulation level of the respective network section(s).

Further, connection points of the connecting element are arranged between the coupling resistances and the measuring resistance of the respective coupling circuits.

In the coupling circuit, which is formed by the coupling resistances and the measuring resistance and which is configured as a series connection, the connection points for the connecting element are located between the coupling resistances and the measuring resistance of the respective coupling circuit.

When the connecting elements are closed, this arrangement leads to a parallel connection of the coupling resistances and to a parallel connection of the measuring resistances. In the equivalent circuit diagram, these parallel connections can each be replaced by a resistance so that a simple structure is formed in terms of switching.

BRIEF DESCRIPTION OF THE DRAWING FIGURES

Other advantageous embodiment features become apparent from the following description and the drawing, which illustrates a preferred embodiment of the invention by way of example.

The FIGURE shows an IT system including an insulation monitoring device according to the invention in a schematic illustration.

DETAILED DESCRIPTION

The FIGURE shows an insulation monitoring device 2 according to the invention for monitoring an ungrounded power supply system (IT system) 4 in a schematic illustration.

The IT system 4 has a feed point 5 and is composed of three network sections 4a, 4b and 4c, for example, which can be interconnected via the coupling switches 6a, 6b. In each network section 4a, 4b, 4c of the power supply system 4, there is an insulation (fault) resistance 8a, 8b, 8c and a network leakage capacitance 10a, 10b, 10c for each conductor against ground, which determine the insulation level of the respective network section 4a, 4b, 4c.

The insulation monitoring device 2 according to the invention, which is used for monitoring the insulation resistances 8a, 8b, 8c, comprises one coupling circuit 12a, 12b and 12c per network section 4a, 4b, 4c and a common signal generator 14 for generating a measuring signal. The coupling circuit 12a, 12b, 12c is composed of a coupling resistance 16a, 16b, 16c that is connected to each active conductor, said coupling resistances 16a, 16b, 16c forming a series connection with a measuring resistance 18a, 18b, 18c. At the measuring resistance 18a, 18b, 18c, a measuring voltage of the measuring signal is tapped and evaluated by means of a signal evaluation unit 20a, 20b, 20c. Since the measuring current that causes the voltage drop at the measuring resistance 18a, 18b, 18c depends on the insulation resistance 8a, 8b, 8c, a statement can thus be made with regard to the insulation level of the IT system.

According to the invention, switchable electrical connecting elements 22a, 22b are provided for connecting adjacent coupling circuits 12a, 12b, 12c. The connection points of the connecting elements 22a, 22b are located between the coupling resistances 16a, 16b, 16c and the measuring resistance 18a, 18b, 18c of the respective coupling circuits 12a, 12b, 12c.

In case of two or more network sections 4a, 4b, 4c that are interconnected by means of the coupling switches 6a, 6b, the respective connecting elements 22a, 22b can also be closed so that a parallel arrangement of the coupling circuits 12a, 12b, 12c is formed. This parallel arrangement can be regarded as a single insulation monitoring device for the interconnected network sections 4a, 4b, 4c, which significantly simplifies monitoring of the insulation resistance 8a, 8b, 8c as compared to the arrangements initially mentioned in connection with the state of the art.

If the network sections 4a, 4b, 4c are to be monitored separately or in a just partially interconnected manner, the connecting elements 22a, 22b can be opened as well when the coupling switches 6a, 6b are open so that separated measuring circuits are formed in which the individual or partially interconnected network sections 4a, 4b, 4c can be monitored with the full functionality of active insulation monitoring. The individual measuring paths are synchronized with one another in such a manner that the common signal generator 14 can be used.

In addition to pure monitoring of the ohmic insulation resistance, the insulation monitoring device according to the invention can also be used for determining the complex-valued insulation resistance (ground impedance) consisting of the ohmic insulation resistance 8a, 8b, 8c and the network leakage capacitance 10a, 10b, 10c.

The invention claimed is:

1. An insulation monitoring device (2) for monitoring an ungrounded power supply system (4) comprising network sections (4a, 4b, 4c) that are switchably interconnected via operable coupling switches (6a, 6b) in order to constantly monitor an insulation resistance against ground of the network sections (4a, 4b, 4c) both in a separated and simultaneously in an interconnected state, comprising a signal generator (14) for constantly generating a measuring signal and a coupling circuit (12a, 12b, 12c) for coupling the measuring signal to the power supply system (4), characterized in that the coupling circuit (12a, 12b, 12c) is provided for each network section (4a, 4b, 4c) to be monitored and that a switchable electrical connecting element (22a, 22b) is arranged for connecting adjacent coupling circuits (12a, 12b, 12c).

2. The insulation monitoring device (2) according to claim 1, characterized in that the coupling circuit (12a, 12b, 12c) comprises a coupling resistance (16a, 16b, 16c) for connection to each active conductor of the network section (4a, 4b, 4c) and a measuring resistance (18a, 18b, 18c) connected in series with the coupling resistance (16a, 16b, 16c).

3. The insulation monitoring device (2) according to claim 2, characterized in that the coupling circuit (12a, 12b, 12c) comprises a signal evaluation unit (20a, 20b, 20c) for evaluating the measured value of the measuring signal that is tapped via the measuring resistance (18a, 18b, 18c).

4. The insulation monitoring device (2) according to claim 2, characterized in that connection points of the connecting element (22a, 22b) are arranged between the coupling resistances (16a, 16b, 16c) and the measuring resistance (18a, 18b, 18c) of the respective coupling circuits (12a, 12b, 12c).

5. The insulation monitoring device (2) according to claim 2, characterized in that the coupling circuit (12a, 12b, 12c) is configured for evaluating the measured value of the measuring signal that is tapped via the measuring resistance (18a, 18b, 18c).

* * * * *